US012690198B2

(12) United States Patent
Shih

(10) Patent No.: US 12,690,198 B2
(45) Date of Patent: Jul. 21, 2026

(54) SEMICONDUCTOR DEVICE STRUCTURE

(71) Applicant: NANYA TECHNOLOGY CORPORATION, New Taipei City (TW)

(72) Inventor: Shing-Yih Shih, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 461 days.

(21) Appl. No.: 18/134,524

(22) Filed: Apr. 13, 2023

(65) Prior Publication Data

US 2024/0349518 A1 Oct. 17, 2024

(51) Int. Cl.
H10B 80/00 (2026.01)
H10P 52/00 (2026.01)
H10W 74/01 (2026.01)

(52) U.S. Cl.
CPC ............. H10B 80/00 (2023.02); H10P 52/00 (2026.01); H10W 74/014 (2026.01)

(58) Field of Classification Search
CPC ..... H10B 80/00; H01L 21/304; H01L 21/561; H01L 25/0655; H01L 23/538
See application file for complete search history.

(56) References Cited

U.S. PATENT DOCUMENTS

2006/0224912 A1* 10/2006 Denham ................... G06F 1/10
713/600
2017/0263518 A1* 9/2017 Yu ........................... H01L 24/16

FOREIGN PATENT DOCUMENTS

| | | |
|---|---|---|
| CN | 111384027 A | 7/2020 |
| CN | 113410223 A | 9/2021 |
| CN | 115732443 A | 3/2023 |
| TW | 200725895 A | 7/2007 |
| TW | 200910474 A | 3/2009 |
| TW | 201232750 A | 8/2012 |
| TW | 201916197 A | 4/2019 |
| TW | 202109817 A | 3/2021 |

OTHER PUBLICATIONS

Office Action and Search Report dated on Jun. 3, 2024 related to Taiwanese Application No. 112122668.
Office Action and Search Report dated on Mar. 7, 2024 related to Taiwanese Application No. 112122668.
Office Action and Search Report dated on Mar. 8, 2024 related to Taiwanese Application No. 113100373.
Office Action and Search Report dated on May 22, 2024 related to Taiwanese Application No. 113100373.

(Continued)

*Primary Examiner* — Timor Karimy
(74) *Attorney, Agent, or Firm* — Xuan Zhang

(57) ABSTRACT

A semiconductor device structure and method of manufacturing the same are provided. The semiconductor device structure includes an interposer and a first electronic component. The interposer includes a first semiconductor die and a second semiconductor die. The first semiconductor die includes a first cache memory and a first memory control circuit. The second semiconductor die includes a second cache memory and a second memory control circuit. The first electronic component is disposed on the interposer and in communication with the first semiconductor die and the second semiconductor die.

12 Claims, 12 Drawing Sheets

(56)                    References Cited

OTHER PUBLICATIONS

Office Action and and the search report mailed on Mar. 10, 2025
related to Taiwanese Application No. 112122668.
Office Action and and the search report mailed on Mar. 10, 2025
related to Taiwanese Application No. 113100373.
Summary translation of Office Action and English Abstracts of
foreign patent documents related to Taiwanese Application No.
112122668 and Taiwanese Application No. 113100373.
Office Action and and the search report mailed on Jan. 20, 2026
related to U.S. Appl. No. 18/237,513.

* cited by examiner

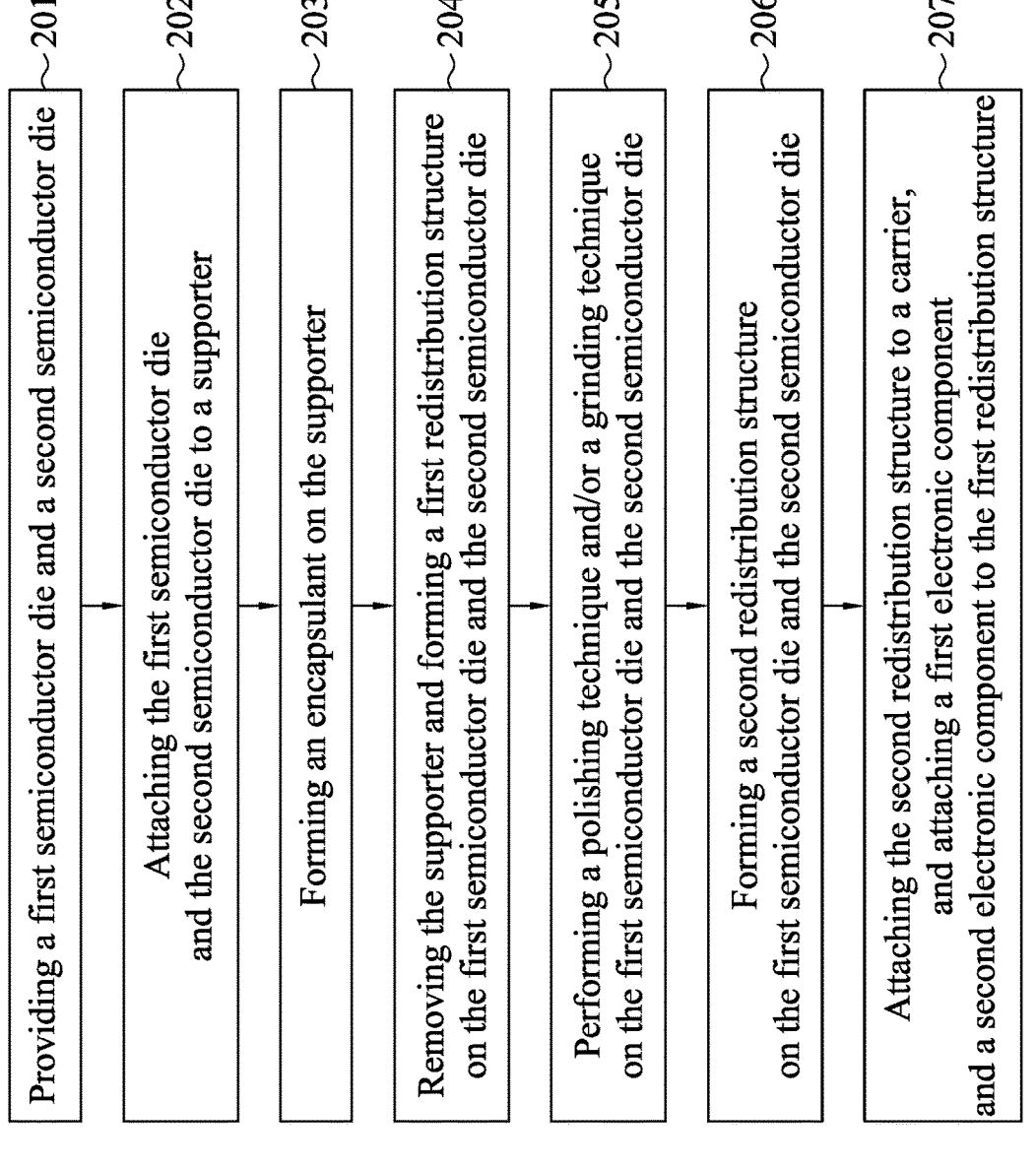

Providing a first semiconductor die and a second semiconductor die ⌇201

Attaching the first semiconductor die and the second semiconductor die to a supporter ⌇202

Forming an encapsulant on the supporter ⌇203

Removing the supporter and forming a first redistribution structure on the first semiconductor die and the second semiconductor die ⌇204

Performing a polishing technique and/or a grinding technique on the first semiconductor die and the second semiconductor die ⌇205

Forming a second redistribution structure on the first semiconductor die and the second semiconductor die ⌇206

Attaching the second redistribution structure to a carrier, and attaching a first electronic component and a second electronic component to the first redistribution structure ⌇207

FIG. 3

SEMICONDUCTOR DEVICE STRUCTURE

TECHNICAL FIELD

The present disclosure relates to a semiconductor device structure and a method of manufacturing the same, and more particularly, to a semiconductor device structure including an interposer.

DISCUSSION OF THE BACKGROUND

With the rapid growth of the electronics industry, integrated circuits (ICs) have achieved high performance and miniaturization. Technological advances in IC materials and design have produced generations of ICs with smaller and more complex circuits.

Memories, such as a cache memory, a dynamic random access memory (DRAM), and the like, are utilized to store data from logic circuits. Recently, a semiconductor device structure, including memories and logic circuits, is facing significant challenges in miniaturization. Therefore, a new semiconductor device structure is required.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device structure. The semiconductor device structure includes an interposer and a first electronic component. The interposer includes a first semiconductor die and a second semiconductor die. The first semiconductor die includes a first cache memory and a first memory control circuit. The second semiconductor die includes a second cache memory and a second memory control circuit. The first electronic component is disposed on the interposer and in communication with the first semiconductor die and the second semiconductor die.

Another aspect of the present disclosure provides another semiconductor device structure. The semiconductor device structure includes an interposer, a first redistribution structure, and a first electronic component. The interposer has a first surface and a second surface opposite to the first surface. The interposer includes a first semiconductor die including a first cache memory and a first memory control circuit. The first redistribution structure is disposed on the second surface of the interposer. The first electronic component is disposed on the first redistribution structure. The first electronic component is electrically connected to the first cache memory.

Another aspect of the present disclosure provides a method of manufacturing a semiconductor device structure. The method includes: providing a first semiconductor die and a second semiconductor die, wherein the first semiconductor die comprises a first cache memory, and the second semiconductor die comprises a second cache memory; forming a first redistribution structure on the first semiconductor die and the semiconductor die; providing a first electronic component on the first redistribution structure, wherein the first electronic component is in communication with either the first cache memory, the second cache memory, or both by the first redistribution structure.

Embodiments of the present disclosure provide a semiconductor device structure. The semiconductor device structure includes an interposer, which includes a cache memory formed within a semiconductor die. Logic circuits are disposed in another electronic component, which reduces the size of said electronic component. In a comparative example, the logic circuits and cache memory are integrated in a die, which increases the size of the die and adversely affects the miniaturization of a semiconductor device structure. In some embodiments, the interposer includes two or more semiconductor dies. Each semiconductor die includes a cache memory and a memory control circuit. The logic circuit may be in communication with any one of semiconductor dies, or in communication with or two or more semiconductor dies. Such design can improve the yield of manufacturing a semiconductor device structure.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 3 is a flowchart illustrating a method of manufacturing a semiconductor device structure, in accordance with some embodiments of the present disclosure.

DETAILED DESCRIPTION

Figure 1A:
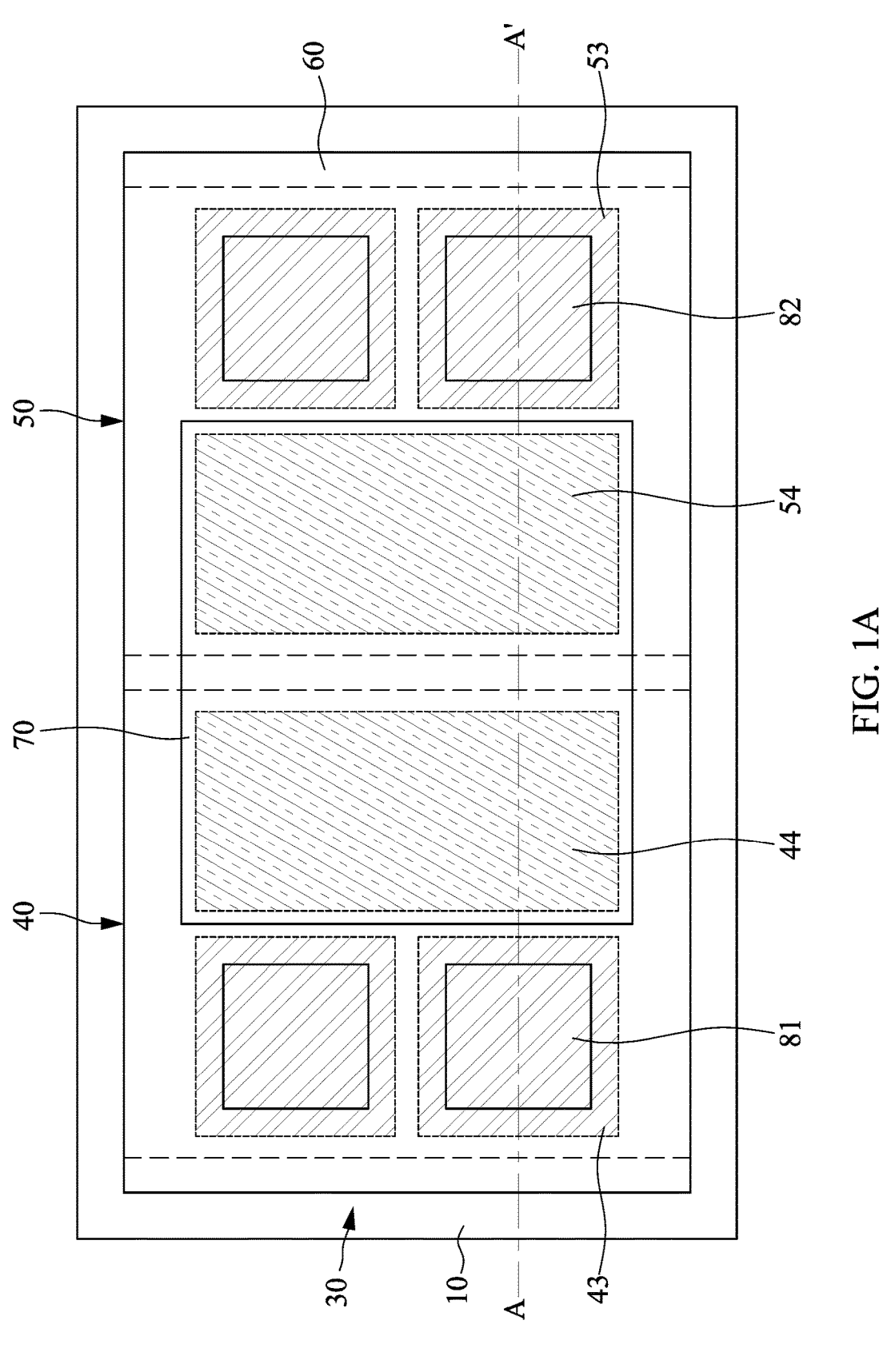
FIG. 1A is a top view of a semiconductor device structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1B:
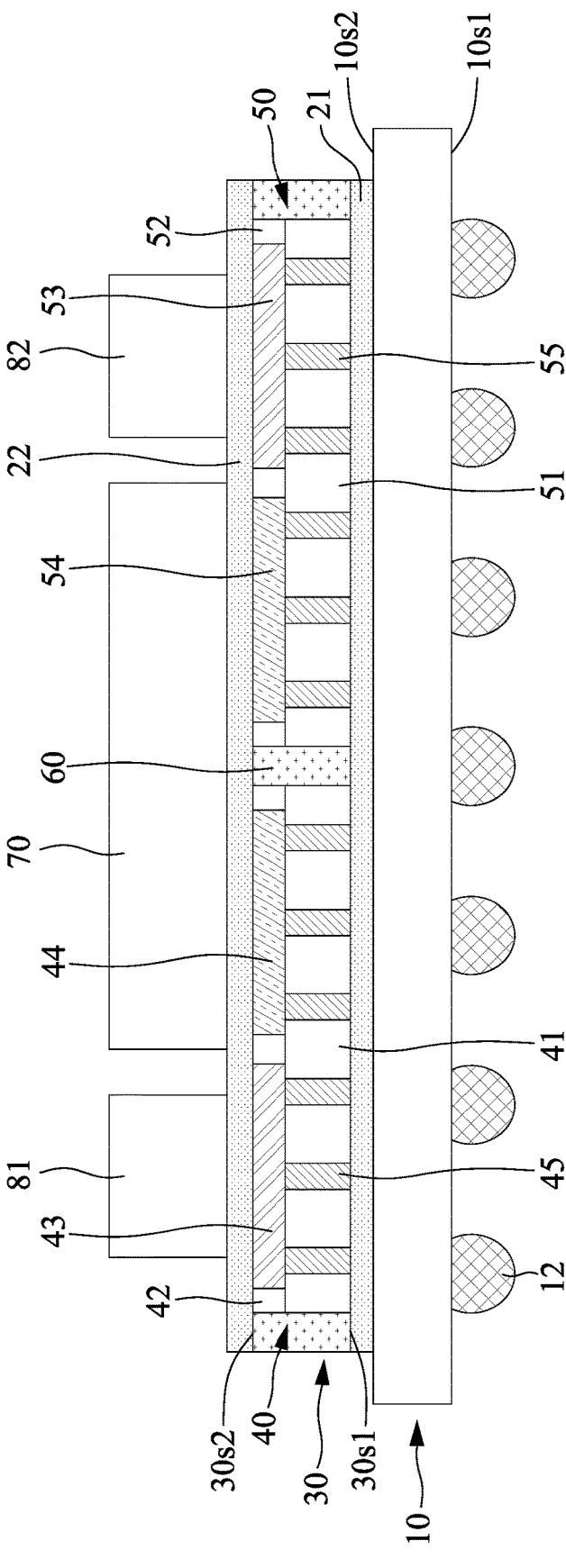
FIG. 1B is a cross-sectional view along line A-A' of the semiconductor device structure as shown in FIG. 1A, in accordance with some embodiments of the present disclosure.

FIG. 1A is a top view of a semiconductor device structure 1a, and FIG. 1B is a cross-sectional view along line A-A' of the semiconductor device structure 1a as shown in FIG. 1A in accordance with some embodiments of the present disclosure.

As shown in FIG. 1A and FIG. 1B, in some embodiments, the semiconductor device structure 1a may include a carrier 10, redistribution structures 21 and 22, an interposer 30, as well as electronic component 70, 81 and 82.

The carrier 10 may be formed of, for example, a printed circuit board (PCB), such as a paper-based copper foil laminate, a composite copper foil laminate, or a polymer-impregnated glass-fiber-based copper foil laminate. The carrier 10 may include a redistribution structure, which includes one or more dielectric layers, one or more conductive traces, and one or more conductive vias (not shown).

The carrier 10 may include a surface 10s1 (or a bottom surface) and a surface 10s2 (or a top surface) opposite to the surface 10s1.

The semiconductor device structure 1a may further include connection elements 12. Each of the connection elements 12 may be disposed on the surface 10s1 of the carrier 10. Each of the connection elements 12 may be configured to electrically connect the semiconductor device structure 1a and external devices (not shown). The connection element 12 may be or include electrical contacts, such as solder balls, conductive bumps, or the like. The connection element 12 may include alloys of gold and tin solder or alloys of silver and tin solder, or other suitable materials.

The redistribution structure 21 may be disposed on the surface 10s2 of the carrier 10. The redistribution structure 21 may be in contact with the carrier 10. The redistribution structure 21 may include one or more dielectric layers, one or more conductive traces, and one or more conductive vias (not shown). The dielectric layer may include an insulating material, a passivation material, a dielectric material or a solder resist material, such as, for example, a benzocyclobutene (BCB) based polymer or a polyimide (PI). The dielectric layer may be made of a photoimageable material. The conductive trace may be disposed on or disposed over a surface (e.g., a top surface or a bottom surface) of the dielectric layer. The conductive via may be disposed on or disposed over a surface (e.g., a top surface or a bottom surface) of the conductive trace. The material of the conductive trace and the conductive via may include, for example, copper, aluminum, titanium, another conductive metal, or an alloy thereof. In some embodiments, the dimension (e.g., width, surface area, and/or aperture) of the conductive trace (or conductive via) within the redistribution structure 21 may be less than that of the conductive trace (or conductive via) within the carrier 10.

In some embodiments, the interposer 30 may be disposed on the surface 10s2 of the carrier 10. In some embodiments, the interposer 30 may be disposed on the redistribution structure 21. In some embodiments, the interposer 30 may be electrically connected to the carrier 10 through the redistribution structure 21. In some embodiments, the interposer 30 may be spaced apart from the carrier 10 by the redistribution structure 21. In some embodiments, the interposer 30 may be configured to be in communication with the electronic component 70. In some embodiments, the interposer 30 may include two or more semiconductor dies. For example, the interposer 30 may include a semiconductor die 40 and a semiconductor die 50. The interposer 30 may have a surface 30s1 and a surface 30s2 opposite to the surface 30s1. The surface 30s1 of the interposer 30 may abut and/or face the redistribution structure 21. The redistribution structure 21 may be disposed on the surface 30s1 of the interposer 30. The surface 30s2 of the interposer 30 may abut and/or face the redistribution structure 22. The surface 30s2 of the interposer 30 may abut and/or face the electronic component 70.

In some embodiments, the semiconductor die 40 may be disposed on the redistribution structure 21. In some embodiments, the semiconductor die 40 may be electrically connected to the carrier 10 through the redistribution structure 21. In some embodiments, the semiconductor die 40 may be spaced apart from the carrier 10 by the redistribution structure 21. In some embodiments, the semiconductor die 40 may be configured to be in communication with the electronic component 70. The semiconductor die 40 may include a semiconductor substrate 41, a circuit region 42, and through vias 45.

The semiconductor substrate 41 may include a bulk semiconductor, a semiconductor-on-insulator (SOI) substrate, or the like. The semiconductor substrate 41 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

The circuit region 42 may be disposed on the semiconductor substrate 41. The circuit region 42 may include one or more dielectric layers and integrated circuits (ICs) at least partially embedded in one or more dielectric layers. The circuit region 42 may include one or more interconnections connected to the ICs. The circuit region 42 may include a memory control circuit 43 and a cache memory 44.

The memory control circuit 43 may be disposed on the semiconductor substrate 41. The memory control circuit 43 may be disposed within the circuit region 42. The memory control circuit 43 may receive signals from the cache memory 44, the electronic component 70, the electronic component 81, and/or other components. The memory control circuit 43 may be configured to administrate and process data transmitted between the electronic component 70 and other circuits (e.g., cache memory 44, electronic component 81, and/or other ICs) operating according to a different communication standard. The memory control circuit 43 may include various memory controllers, for example, devices which may control IDE (integrated device electronics), SATA (serial advanced technology attachment), SCSI (small computer system Interface), RAID (redundant array of independent disks), an SSD (solid state disk), eSATA (external SATA), PCMCIA (personal computer memory card international association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The cache memory 44 may be disposed on the semiconductor substrate 41. The cache memory 44 may be disposed within the circuit region 42. In some embodiments, the memory control circuit 43 may be in communication with the cache memory 44. In some embodiments, the cache memory 44 may be configured to store data (e.g., a signal from the electronic component 70) temporarily. In some embodiments, the cache memory 44 may be configured to compensate for a difference in data processing speed between the electronic component 70 operating at a high speed and an external device (not shown) operating at a low speed. In some embodiments, the cache memory 44 may be configured to store data for performing the operation, data corresponding to a result of performing the operation, or an address of data for which the operation is performed. In some embodiments, the cache memory 44 may include a static random access memory (SRAM) or other suitable memories.

In some embodiments, the through via 45 may penetrate the semiconductor substrate 41. In some embodiments, the through via 45 may be disposed between the circuit region 42 and the redistribution structure 21. In some embodiments, the through via 45 may be disposed between the memory control circuit 43 and the redistribution structure 21. In some embodiments, the through via 45 may be disposed between the cache memory 44 and the redistribution structure 21. In some embodiments, the through via 45 may be electrically connected to the memory control circuit 43. In some embodiments, the through via 45 may be electrically connected to the cache memory 44. In some embodiments, the through via 45 may include a through-silicon via (TSV). In some embodiments, the through via 45 may include copper, aluminum, titanium, another conductive metal, or an alloy thereof.

In some embodiments, the semiconductor die 50 may be disposed on the redistribution structure 21. In some embodiments, the semiconductor die 50 may be electrically connected to the carrier 10 through the redistribution structure 21. In some embodiments, the semiconductor die 50 may be spaced apart from the carrier 10 by the redistribution structure 21. In some embodiments, the semiconductor die 50 may be configured to be in communication with the electronic component 70. The semiconductor dies 40 and 50 may be located at the same level. The semiconductor die 40 may be spaced apart from the semiconductor die 50. The semiconductor die 50 may include a semiconductor substrate 51, a circuit region 52, and through vias 55.

The semiconductor substrate 51 may include a bulk semiconductor, a semiconductor-on-insulator (SOI) substrate, or the like. The semiconductor substrate 51 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

The circuit region 52 may be disposed on the semiconductor substrate 51. The circuit region 52 may include one or more dielectric layers and integrated circuits (ICs) at least partially embedded in one or more dielectric layers. The circuit region 52 may include a memory control circuit 53 and a cache memory 54.

The memory control circuit 53 may be disposed on the semiconductor substrate 51. The memory control circuit 53 may be disposed within the circuit region 52. The memory control circuit 53 may receive signals from the cache memory 54, the electronic component 70, the electronic component 82, and/or other components. The memory control circuit 53 may be configured to administrate and process data transmitted between the electronic component 70 and other circuits (e.g., cache memory 54, electronic component 82, and/or other ICs) operating according to a different communication standard. The memory control circuit 53 may include various memory controllers, for example, devices which may control IDE (integrated device electronics), SATA (serial advanced technology attachment), SCSI (small computer system Interface), RAID (redundant array of independent disks), an SSD (solid state disk), eSATA (external SATA), PCMCIA (personal computer memory card international association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The cache memory 54 may be disposed on the semiconductor substrate 51. The cache memory 54 may be disposed within the circuit region 52. In some embodiments, the memory control circuit 53 may be in communication with the cache memory 54. In some embodiments, the cache memory 54 may be configured to store data (e.g., a signal from the electronic component 70) temporarily. In some embodiments, the cache memory 54 may be configured to compensate for a difference in data processing speed between the electronic component 70 operating at a high speed and an external device (not shown) operating at a low speed. In some embodiments, the cache memory 54 may be configured to store data for performing the operation, data corresponding to a result of performing the operation, or an address of data for which the operation is performed. In some embodiments, the cache memory 54 may include a SRAM or other suitable memories.

In some embodiments, the through via 55 may penetrate the semiconductor substrate 51. In some embodiments, the through via 55 may be disposed between the circuit region 52 and the redistribution structure 21. In some embodiments, the through via 55 may be disposed between the memory control circuit 53 and the redistribution structure 21. In some embodiments, the through via 55 may be disposed between the cache memory 54 and the redistribution structure 21. In some embodiments, the through via 55 may be electrically connected to the memory control circuit 53. In some embodiments, the through via 55 may be electrically connected to the cache memory 54. In some embodiments, the through via 55 may include a through-silicon via (TSV). In some embodiments, the through via 55 may include copper, aluminum, titanium, another conductive metal, or an alloy thereof.

In some embodiments, the circuits (e.g., the memory control circuit 43 and cache memory 44) of the semiconductor die 40 and the circuits (e.g., the memory control circuit 53 and cache memory 54) of the semiconductor die 50 may have a mirror symmetry. In some embodiments, the cache memory 44 of the semiconductor die 40 may be closer to the cache memory 54 of the semiconductor die 50 than the memory control circuit 43 is. The cache memory 44 may be disposed between the cache memory 54 and the memory control circuit 53.

In some embodiments, the interposer 30 may further include an encapsulant 60. In some embodiments, the encapsulant 60 may encapsulate the semiconductor die 40. In some embodiments, the encapsulant 60 may encapsulate the semiconductor die 50. In some embodiments, the encapsulant 60 may be disposed between the redistribution structures 21 and 22. In some embodiments, the encapsulant 60 may be in contact with the redistribution structure 21. In some embodiments, the encapsulant 60 may be in contact with the redistribution structure 22. In some embodiments, the bottom surface (not annotated) of the encapsulant 60 may be substantially coplanar with bottom surface (not annotated) of the semiconductor die 40. In some embodiments, the bottom surface of the encapsulant 60 may be substantially coplanar with bottom surface (not annotated) of the semiconductor die 50. In some embodiments, the encapsulant 60 includes, for example, organic materials (e.g., a molding compound, a bismaleimide triazine (BT), a polyimide (PI), a polybenzoxazole (PBO), a solder resist, an ABF, a polypropylene (PP) or an epoxy-based material), inorganic materials (e.g., a silicon, a glass, a ceramic or a quartz), liquid and/or dry-film materials or a combination thereof. Suitable fillers may also be included, such as powdered $SiO_2$.

In some embodiments, the redistribution structure 22 may be disposed on the surface 30s2 of the interposer 30. The redistribution structure 22 may include one or more dielectric layers, one or more conductive traces, and one or more conductive vias (not shown). The dielectric layer may include an insulating material, a passivation material, a dielectric material or a solder resist material, such as, for example, a benzocyclobutene (BCB) based polymer or a polyimide (PI). The dielectric layer may be made of a photoimageable material. The conductive trace may be disposed on or disposed over a surface (e.g., a top surface or a bottom surface) of the dielectric layer. The conductive via may be disposed on or disposed over a surface (e.g., a top surface or a bottom surface) of the conductive trace. The material of the conductive trace and the conductive via may include, for example, copper, aluminum, titanium, another conductive metal, or an alloy thereof. In some embodiments, the dimension (e.g., width, surface area, and/or aperture) of the conductive trace (or conductive via) within the redistribution structure 22 may be less than that of the conductive trace (or conductive via) within the carrier 10. In some embodiments, the lateral surface of the redistribution structure 22 may be aligned with the lateral surface of the redistribution structure 21. In some embodiments, the lateral surface of the redistribution structure 22 may be aligned with the lateral surface of the interposer 30. In some embodiments, the lateral surface of the redistribution structure 22 may be aligned with the lateral surface of the encapsulant 60.

In some embodiments, the electronic component 70 may be disposed on the surface 30s2 of the interposer 30. In some embodiments, the electronic component 70 may be disposed on the redistribution structure 22. In some embodiments, the electronic component 70 may be spaced apart from the interposer 30 by the redistribution structure 22. In some embodiments, the electronic component 70 may vertically overlap the cache memory 44. In some embodiments, the electronic component 70 may vertically overlap the cache memory 54. In some embodiments, the electronic component 70 may be free from vertically overlapping the memory control circuit 43. In some embodiments, the electronic component 70 may be free from vertically overlapping the memory control circuit 53. In some embodiments, the electronic component 70 may be electrically connected to or be in communication with the memory control circuit 43 by the redistribution structure 22. In some embodiments, the electronic component 70 may be electrically connected to or be in communication with the cache memory 44 by the redistribution structure 22. In some embodiments, the electronic component 70 may be electrically connected to or be in communication with the memory control circuit 53 by the redistribution structure 22. In some embodiments, the electronic component 70 may be electrically connected to or be in communication with the cache memory 54 by the redistribution structure 22. In some embodiments, the electronic component 70 may be electrically connected to or be in communication with both the cache memories 44 and 54 by the redistribution structure 22. In some embodiments, the electronic component 70 may include logic circuits and/or other suitable circuits. In some embodiments, the electronic component 70 may include a central processing unit (CPU), a microprocessor unit (MPU), a graphics processing unit (GPU), a microcontroller unit (MCU), a field-programmable gate array (FPGA), an application processor (AP) or another type of IC. In some embodiments, the electronic component 70 does not include a cache memory.

In some embodiments, the electronic component 81 may be disposed on the surface 30s2 of the interposer 30. In some embodiments, the electronic component 81 may be disposed on the redistribution structure 22. In some embodiments, the electronic component 81 may be spaced apart from the interposer 30 by the redistribution structure 22. In some embodiments, the electronic component 81 may vertically overlap the memory control circuit 43. In some embodiments, the electronic component 81 may be free from vertically overlapping the cache memory 44. In some embodiments, the electronic component 81 may be electrically connected to or be in communication with the electronic component 70 by the redistribution structure 22. In some embodiments, the electronic component 81 may be electrically connected to or be in communication with the memory control circuit 43 by the redistribution structure 22. In some embodiments, the electronic component 81 may include a dynamic random access memory (DRAM). For example, the electronic component 81 may include at least a transistor(s), at least a capacitor(s), and/or other suitable elements. In some embodiments, the electronic component 81 may include a high bandwidth memory (HBM).

In some embodiments, the electronic component 82 may be disposed on the surface 30s2 of the interposer 30. In some embodiments, the electronic component 82 may be disposed on the redistribution structure 22. In some embodiments, the electronic component 82 may be spaced apart from the interposer 30 by the redistribution structure 22. In some embodiments, the electronic component 82 may vertically overlap the memory control circuit 53. In some embodiments, the electronic component 82 may be free from vertically overlapping the cache memory 54. In some embodiments, the electronic component 82 may be electrically connected to or be in communication with the electronic component 70 by the redistribution structure 22. In some embodiments, the electronic component 82 may be electrically connected to or be in communication with the memory control circuit 53 by the redistribution structure 22. In some embodiments, the electronic component 82 may include a DRAM. For example, the electronic component 82 may include at least a transistor(s), at least a capacitor(s), and/or other suitable elements. In some embodiments, the electronic component 82 may include a HBM.

In a comparative example, the logic circuits and cache memory(s) are integrated as a die, which increases the size of the die and adversely affects the miniaturization of a semiconductor device structure. In the embodiments of the present disclosure, the semiconductor device structure includes an electronic component and a semiconductor die. The logic circuit(s) and the cache memory are disposed within the electronic component (e.g., 70) and the semiconductor die (e.g., 40 and/or 50), respectively. Therefore, the size of the electronic component is reduced, which thereby assists in the miniaturization of the semiconductor device structure. Further, the cache memories may include at least two portions disposed within two semiconductor dies. As a result, the logic circuit(s) may be in communication with one or two or more semiconductor dies according to requirements. Further, such design may improves the yield of manufacturing the semiconductor device structure.

Figure 2A:
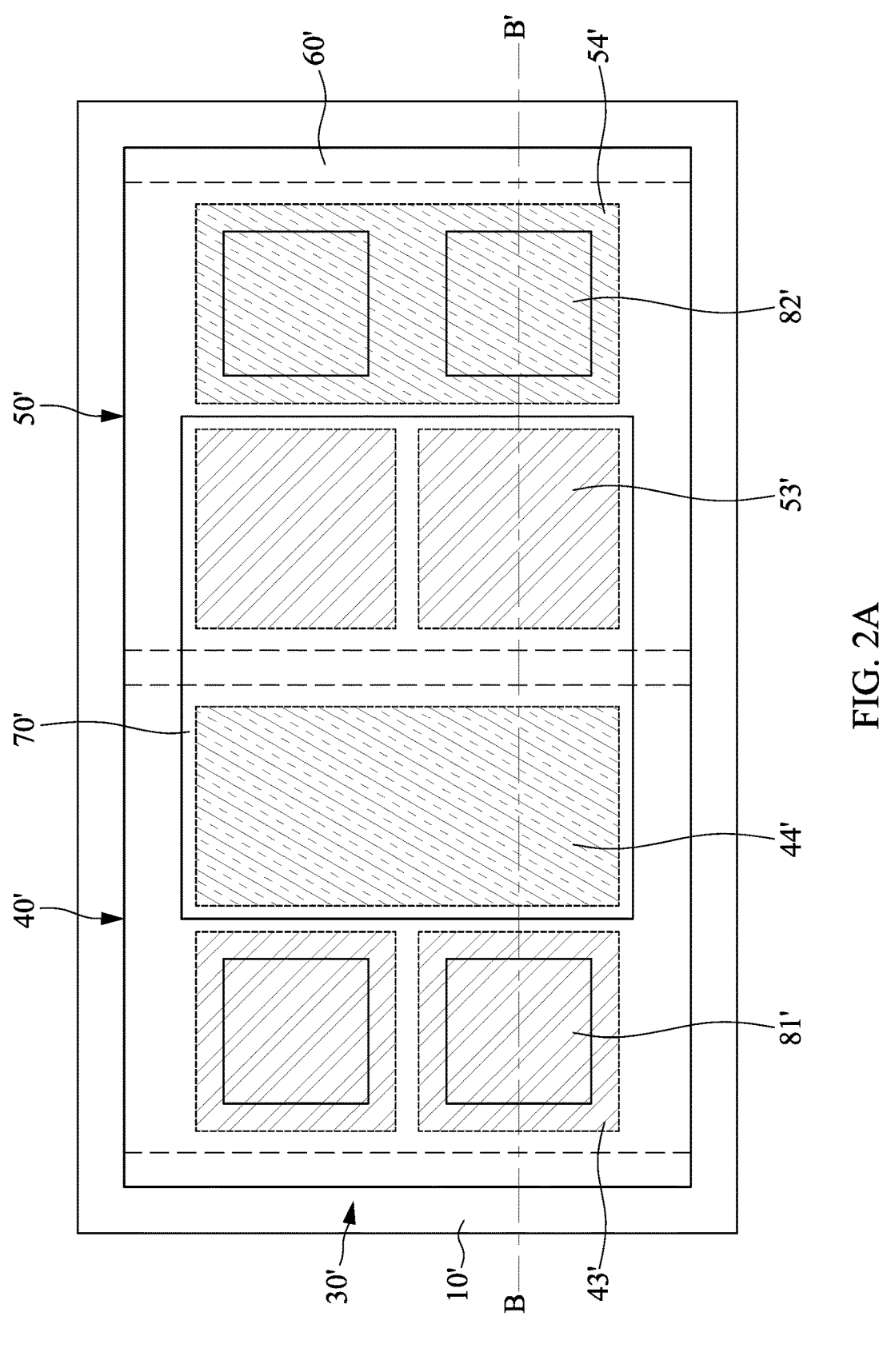
FIG. 2A is a top view of a semiconductor device structure, in accordance with some embodiments of the present disclosure.
Figure 2B:
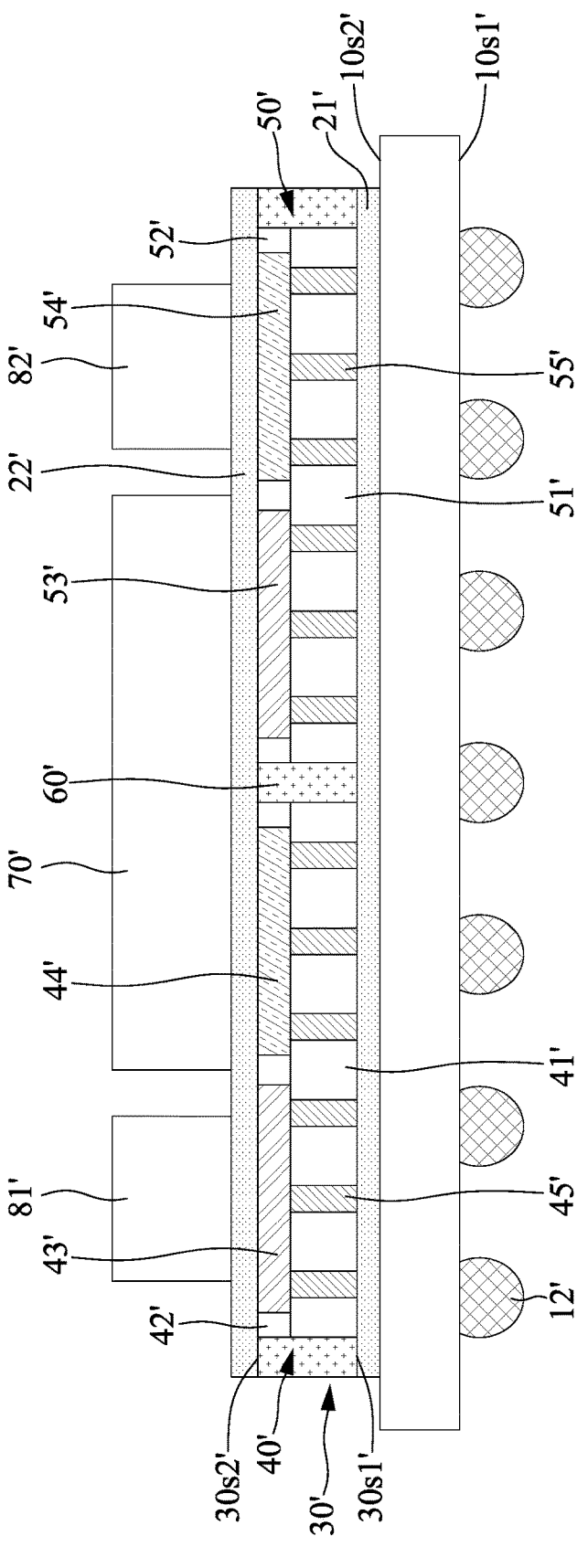
FIG. 2B is a cross-sectional view along line B-B' of the semiconductor device structure as shown in FIG. 2A, in accordance with some embodiments of the present disclosure.

FIG. 2A is a top view of a semiconductor device structure 1b, and FIG. 2B is a cross-sectional view along line B-B' of the semiconductor device structure 1b as shown in FIG. 2A in accordance with some embodiments of the present disclosure.

As shown in FIG. 2A and FIG. 2B, in some embodiments, the semiconductor device structure 1b may include a carrier 10', redistribution structures 21' and 22', an interposer 30', as well as electronic component 70', 81' and 82'.

The carrier 10' may be formed of, for example, a printed circuit board (PCB), such as a paper-based copper foil laminate, a composite copper foil laminate, or a polymer-impregnated glass-fiber-based copper foil laminate. The carrier 10' may include a redistribution structure, which includes one or more dielectric layers, one or more conductive traces, and one or more conductive vias (not shown). The carrier 10' may include a surface 10s1' (or a bottom surface) and a surface 10s2' (or a top surface) opposite to the surface 10s1'.

The semiconductor device structure 1b may further include connection elements 12'. Each of the connection elements 12' may be disposed on the surface 10s1' of the carrier 10'. Each of the connection elements 12' may be configured to electrically connect the semiconductor device structure 1b and external devices (not shown). The connection element 12' may be or include electrical contacts, such as solder balls, conductive bumps, or the like. The connection element 12' may include alloys of gold and tin solder or alloys of silver and tin solder, or other suitable materials.

The redistribution structure 21' may be disposed on the surface 10s2' of the carrier 10'. The redistribution structure 21' may be in contact with the carrier 10'. The redistribution structure 21' may include one or more dielectric layers, one or more conductive traces, and one or more conductive vias (not shown). The dielectric layer may include an insulating material, a passivation material, a dielectric material or a solder resist material, such as, for example, a benzocyclobutene (BCB) based polymer or a polyimide (PI). The dielectric layer may be made of a photoimageable material. The conductive trace may be disposed on or disposed over a surface (e.g., a top surface or a bottom surface) of the dielectric layer. The conductive via may be disposed on or disposed over a surface (e.g., a top surface or a bottom surface) of the conductive trace. The material of the conductive trace and the conductive via may include, for example, copper, aluminum, titanium, another conductive metal, or an alloy thereof. In some embodiments, the dimension (e.g., width, surface area, and/or aperture) of the conductive trace (or conductive via) within the redistribution structure 21' may be less than that of the conductive trace (or conductive via) within the carrier 10'.

In some embodiments, the interposer 30' may be disposed on the surface 10s2' of the carrier 10'. In some embodiments, the interposer 30' may be disposed on the redistribution structure 21'. In some embodiments, the interposer 30' may be electrically connected to the carrier 10' through the redistribution structure 21'. In some embodiments, the interposer 30' may be spaced apart from the carrier 10' by the redistribution structure 21'. In some embodiments, the interposer 30' may be configured to be in communication with the electronic component 70'. In some embodiments, the interposer 30' may include two or more semiconductor dies. For example, the interposer 30' may include a semiconductor die 40' and a semiconductor die 50'. The interposer 30' may have a surface 30s1' and a surface 30s2' opposite to the surface 30s1'. The surface 30s1' of the interposer 30' may abut and/or face the redistribution structure 21'. The redistribution structure 21' may be disposed on the surface 30s1' of the interposer 30'. The surface 30s2' of the interposer 30' may abut and/or face the redistribution structure 22'. The surface 30s2' of the interposer 30' may abut and/or face the electronic component 70'.

In some embodiments, the semiconductor die 40' may be disposed on the redistribution structure 21'. In some embodiments, the semiconductor die 40' may be electrically connected to the carrier 10' through the redistribution structure 21'. In some embodiments, the semiconductor die 40' may be spaced apart from the carrier 10' by the redistribution structure 21'. In some embodiments, the semiconductor die 40' may be configured to be in communication with the electronic component 70'. The semiconductor die 40' may include a semiconductor substrate 41', a circuit region 42', and through vias 45'.

The semiconductor substrate 41' may include a bulk semiconductor, a semiconductor-on-insulator (SOI) substrate, or the like. The semiconductor substrate 41' can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

The circuit region 42' may be disposed on the semiconductor substrate 41'. The circuit region 42' may include one or more dielectric layers and integrated circuits (ICs) at least partially embedded in one or more dielectric layers. The circuit region 42' may include one or more interconnections connected to the ICs. The circuit region 42' may include a memory control circuit 43' and a cache memory 44'.

The memory control circuit 43' may be disposed on the semiconductor substrate 41'. The memory control circuit 43' may be disposed within the circuit region 42'. The memory control circuit 43' may receive signals from the cache memory 44', the electronic component 70', the electronic component 81', and/or other components. The memory control circuit 43' may be configured to administrate and process data transmitted between the electronic component 70' and other circuits (e.g., cache memory 44', electronic component 81', and/or other ICs) operating according to a different communication standard. The memory control circuit 43' may include various memory controllers, for example, devices which may control IDE (integrated device electronics), SATA (serial advanced technology attachment), SCSI (small computer system Interface), RAID (redundant array of independent disks), an SSD (solid state disk), eSATA (external SATA), PCMCIA (personal computer memory card international association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The cache memory 44' may be disposed on the semiconductor substrate 41'. The cache memory 44' may be disposed within the circuit region 42'. In some embodiments, the memory control circuit 43' may be in communication with the cache memory 44'. In some embodiments, the cache memory 44' may be configured to store data (e.g., a signal from the electronic component 70') temporarily. In some embodiments, the cache memory 44' may be configured to compensate for a difference in data processing speed between the electronic component 70' operating at a high speed and an external device (not shown) operating at a low speed. In some embodiments, the cache memory 44' may be configured to store data for performing the operation, data corresponding to a result of performing the operation, or an address of data for which the operation is performed. In some embodiments, the cache memory 44' may include a static random access memory (SRAM) or other suitable memories.

In some embodiments, the through via 45' may penetrate the semiconductor substrate 41'. In some embodiments, the through via 45' may be disposed between the circuit region 42' and the redistribution structure 21'. In some embodiments, the through via 45' may be disposed between the memory control circuit 43' and the redistribution structure 21'. In some embodiments, the through via 45' may be disposed between the cache memory 44' and the redistribution structure 21'. In some embodiments, the through via 45' may be electrically connected to the memory control circuit 43'. In some embodiments, the through via 45' may be electrically connected to the cache memory 44'. In some embodiments, the through via 45' may include a through-silicon via (TSV). In some embodiments, the through via 45' may include copper, aluminum, titanium, another conductive metal, or an alloy thereof.

In some embodiments, the semiconductor die 50' may be disposed on the redistribution structure 21'. In some embodiments, the semiconductor die 50' may be electrically connected to the carrier 10' through the redistribution structure 21'. In some embodiments, the semiconductor die 50' may be spaced apart from the carrier 10' by the redistribution structure 21'. In some embodiments, the semiconductor die 50' may be configured to be in communication with the electronic component 70'. The semiconductor dies 40' and 50' may be located at the same level. The semiconductor die 40' may be spaced apart from the semiconductor die 50'. The semiconductor die 50' may include a semiconductor substrate 51', a circuit region 52', and through vias 55'.

The semiconductor substrate 51' may include a bulk semiconductor, a semiconductor-on-insulator (SOI) substrate, or the like. The semiconductor substrate 51' can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

The circuit region 52' may be disposed on the semiconductor substrate 51'. The circuit region 52' may include one or more dielectric layers and integrated circuits (ICs) at least partially embedded in one or more dielectric layers. The circuit region 52' may include a memory control circuit 53' and a cache memory 54'.

The memory control circuit 53' may be disposed on the semiconductor substrate 51'. The memory control circuit 53' may be disposed within the circuit region 52'. The memory control circuit 53' may receive signals from the cache memory 54', the electronic component 70', the electronic component 82', and/or other components. The memory control circuit 53' may be configured to administrate and process data transmitted between the electronic component 70' and other circuits (e.g., cache memory 54', electronic component 82', and/or other ICs) operating according to a different communication standard. The memory control circuit 53' may include various memory controllers, for example, devices which may control IDE (integrated device electronics), SATA (serial advanced technology attachment), SCSI (small computer system Interface), RAID (redundant array of independent disks), an SSD (solid state disk), eSATA (external SATA), PCMCIA (personal computer memory card international association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The cache memory 54' may be disposed on the semiconductor substrate 51'. The cache memory 54' may be disposed within the circuit region 52'. In some embodiments, the memory control circuit 53' may be in communication with the cache memory 54'. In some embodiments, the cache memory 54' may be configured to store data (e.g., a signal from the electronic component 70') temporarily. In some embodiments, the cache memory 54' may be configured to compensate for a difference in data processing speed between the electronic component 70' operating at a high speed and an external device (not shown) operating at a low speed. In some embodiments, the cache memory 54' may be configured to store data for performing the operation, data corresponding to a result of performing the operation, or an address of data for which the operation is performed. In some embodiments, the cache memory 54' may include a SRAM or other suitable memories.

In some embodiments, the through via 55' may penetrate the semiconductor substrate 51'. In some embodiments, the through via 55' may be disposed between the circuit region 52' and the redistribution structure 21'. In some embodiments, the through via 55' may be disposed between the memory control circuit 53' and the redistribution structure 21'. In some embodiments, the through via 55' may be disposed between the cache memory 54' and the redistribution structure 21'. In some embodiments, the through via 55' may be electrically connected to the memory control circuit 53'. In some embodiments, the through via 55' may be electrically connected to the cache memory 54'. In some embodiments, the through via 55' may include a through-silicon via (TSV). In some embodiments, the through via 55' may include copper, aluminum, titanium, another conductive metal, or an alloy thereof.

In some embodiments, the cache memory 44' of the semiconductor die 40' may be closer to the memory control circuit 53' than to the cache memory 54'. In some embodiments, the memory control circuit 53' may be disposed between the cache memory 44' and the cache memory 54'.

In some embodiments, the interposer 30' may further include an encapsulant 60'. In some embodiments, the encapsulant 60' may encapsulate the semiconductor die 40'. In some embodiments, the encapsulant 60' may encapsulate the semiconductor die 50'. In some embodiments, the encapsulant 60' may be disposed between the redistribution structures 21' and 22'. In some embodiments, the encapsulant 60' may be in contact with the redistribution structure 21'. In some embodiments, the encapsulant 60' may be in contact with the redistribution structure 22'. In some embodiments, the bottom surface (not annotated) of the encapsulant 60' may be substantially coplanar with bottom surface (not annotated) of the semiconductor die 40'. In some embodiments, the bottom surface of the encapsulant 60' may be substantially coplanar with bottom surface (not annotated) of the semiconductor die 50'. In some embodiments, the encapsulant 60' includes, for example, organic materials (e.g., a molding compound, a bismaleimide triazine (BT), a polyimide (PI), a polybenzoxazole (PBO), a solder resist, an ABF, a polypropylene (PP) or an epoxy-based material), inorganic materials (e.g., a silicon, a glass, a ceramic or a quartz), liquid and/or dry-film materials or a combination thereof. Suitable fillers may also be included, such as powdered $SiO_2$.

In some embodiments, the redistribution structure 22' may be disposed on the surface 30s2' of the interposer 30'. The redistribution structure 22' may include one or more dielectric layers, one or more conductive traces, and one or more conductive vias (not shown). The dielectric layer may include an insulating material, a passivation material, a dielectric material or a solder resist material, such as, for example, a benzocyclobutene (BCB) based polymer or a polyimide (PI). The dielectric layer may be made of a photoimageable material. The conductive trace may be disposed on or disposed over a surface (e.g., a top surface or a bottom surface) of the dielectric layer. The conductive via may be disposed on or disposed over a surface (e.g., a top surface or a bottom surface) of the conductive trace. The material of the conductive trace and the conductive via may include, for example, copper, aluminum, titanium, another conductive metal, or an alloy thereof. In some embodiments, the dimension (e.g., width, surface area, and/or aperture) of the conductive trace (or conductive via) within the redistribution structure 22' may be less than that of the conductive trace (or conductive via) within the carrier 10'. In some embodiments, the lateral surface of the redistribution structure 22' may be aligned with the lateral surface of the redistribution structure 21'. In some embodiments, the lateral surface of the redistribution structure 22' may be aligned with the lateral surface of the interposer 30'. In some embodiments, the lateral surface of the redistribution structure 22' may be aligned with the lateral surface of the encapsulant 60'.

In some embodiments, the electronic component 70' may be disposed on the surface 30s2' of the interposer 30'. In some embodiments, the electronic component 70' may be disposed on the redistribution structure 22'. In some embodiments, the electronic component 70' may be spaced apart from the interposer 30' by the redistribution structure 22'. In some embodiments, the electronic component 70' may vertically overlap the cache memory 44'. In some embodiments, the electronic component 70' may vertically overlap the memory control circuit 53'. In some embodiments, the electronic component 70' may be free from vertically overlapping the memory control circuit 43'. In some embodiments, the electronic component 70' may be free from vertically overlapping the cache memory 54'. In some embodiments, the electronic component 70' may be electrically connected to or be in communication with the memory control circuit 43' by the redistribution structure 22'. In some embodiments, the electronic component 70' may be electrically connected to or be in communication with the cache memory 44' by the redistribution structure 22'. In some embodiments, the electronic component 70' may be electrically connected to or be in communication with the memory control circuit 53' by the redistribution structure 22'. In some embodiments, the electronic component 70' may be electrically connected to or be in communication with the cache memory 54' by the redistribution structure 22'. In some embodiments, the electronic component 70' may be electrically connected to or be in communication with both the cache memories 44' and 54' by the redistribution structure 22'. In some embodiments, the electronic component 70' may include logic circuits and/or other suitable circuits. In some embodiments, the electronic component 70' may include a central processing unit (CPU), a microprocessor unit (MPU), a graphics processing unit (GPU), a microcontroller unit (MCU), a field-programmable gate array (FPGA), an application processor (AP) or another type of IC. In some embodiments, the electronic component 70' does not include a cache memory.

In some embodiments, the electronic component 81' may be disposed on the surface 30s2' of the interposer 30'. In some embodiments, the electronic component 81' may be disposed on the redistribution structure 22'. In some embodiments, the electronic component 81' may be spaced apart from the interposer 30' by the redistribution structure 22'. In some embodiments, the electronic component 81' may vertically overlap the memory control circuit 43'. In some embodiments, the electronic component 81' may be free from vertically overlapping the cache memory 44'. In some embodiments, the electronic component 81' may be electrically connected to or be in communication with the electronic component 70' by the redistribution structure 22'. In some embodiments, the electronic component 81' may be electrically connected to or be in communication with the memory control circuit 43' by the redistribution structure 22'. In some embodiments, the electronic component 81' may include a dynamic random access memory (DRAM). For example, the electronic component 81' may include at least a transistor(s), at least a capacitor(s), and/or other suitable elements. In some embodiments, the electronic component 81' may include a high bandwidth memory (HBM).

In some embodiments, the electronic component 82' may be disposed on the surface 30s2' of the interposer 30'. In some embodiments, the electronic component 82' may be disposed on the redistribution structure 22'. In some embodiments, the electronic component 82' may be spaced apart from the interposer 30' by the redistribution structure 22'. In some embodiments, the electronic component 82' may vertically overlap the cache memory 54'. In some embodiments, the electronic component 82' may be free from vertically overlapping the memory control circuit 53'. In some embodiments, the electronic component 82' may be electrically connected to or be in communication with the electronic component 70' by the redistribution structure 22'. In some embodiments, the electronic component 82' may be electrically connected to or be in communication with the memory control circuit 53' by the redistribution structure 22'. In some embodiments, the electronic component 82' may include a DRAM. For example, the electronic component 82' may include at least a transistor(s), at least a capacitor(s), and/or other suitable elements. In some embodiments, the electronic component 82' may include a HBM.

In a comparative example, the logic circuits and cache memory(s) are integrated as a die, which increases the size of the die and adversely affects the miniaturization of a semiconductor device structure. In the embodiments of the present disclosure, the semiconductor device structure includes an electronic component and a semiconductor die. The logic circuit(s) and the cache memory are disposed within the electronic component (e.g., 70') and the semiconductor die (e.g., 40' and/or 50'), respectively. Therefore, the size of the electronic component is reduced, which thereby assists in the miniaturization of the semiconductor device structure. Further, the cache memories may include at least two portions disposed within two semiconductor dies. As a result, the logic circuit(s) may be in communication with one or two or more semiconductor dies according to requirements. Further, such design may improves the yield of manufacturing the semiconductor device structure.

FIG. 3 is a flowchart illustrating a method 2 of manufacturing a semiconductor device structure, in accordance with some embodiments of the present disclosure.

The method 2 begins with operation 201 in which a first semiconductor die and a second semiconductor die may be provided. The first semiconductor die may have a bottom surface and a top surface opposite to the bottom surface. The first semiconductor die may include a first semiconductor substrate, a first circuit region, and first through vias. The first circuit region may include a first memory control circuit and a first cache memory. The first memory control circuit may be located adjacent to the top surface of the first semiconductor die. The first cache memory may be located adjacent to the top surface of the first semiconductor die. The first through via may penetrate a portion of the first semiconductor substrate. The second semiconductor die may have a bottom surface and a top surface opposite to the bottom surface. The second semiconductor die may include a second semiconductor substrate, a second circuit region, and second through vias. The second circuit region may include a second memory control circuit and a second cache memory. The second memory control circuit may be located adjacent to the top surface of the second semiconductor die. The second cache memory may be located adjacent to the top surface of the second semiconductor die. The second through via may penetrate a portion of the second semiconductor substrate.

The method 2 continues with operation 202 in which the first semiconductor die and the second semiconductor die may be attached to a supporter. The top surface of the first semiconductor die may be attached to the supporter. The top surface of the first semiconductor die may be attached to the supporter.

The method 2 continues with operation 203 in which an encapsulant may be formed on the supporter. The encapsulant may encapsulate the first semiconductor die. The encapsulant may encapsulate the second semiconductor die.

The method 2 continues with operation 204 in which the supporter may be removed from the first semiconductor die and the second semiconductor die. A first redistribution structure may be formed on the top surface of the first semiconductor die. The first redistribution structure may be formed on the top surface of the second semiconductor die. The first redistribution structure may be formed on the top surface of the encapsulant.

The method 2 continues with operation 205 in which a polishing technique and/or a grinding technique may be performed on the bottom surface of the first semiconductor die and on the bottom surface of the second semiconductor die. A portion of the first semiconductor substrate may be removed. A portion of the second semiconductor substrate may be removed. The first through via may be exposed from the bottom surface of the first semiconductor die. The second through via may be exposed from the bottom surface of the second semiconductor die. As a result, an interposer, including the first semiconductor die and second semiconductor die, may be produced.

The method 2 continues with operation 206 in which a second redistribution structure may be formed on the bottom surface of the first semiconductor die. The second redistribution structure may be formed on the bottom surface of the second semiconductor die. The second redistribution structure may be formed on the bottom surface of the encapsulant.

The method 2 continues with operation 207 in which the second redistribution structure may be attached to the carrier. The first electronic component (e.g., logic circuits) may be attached to the first redistribution structure. Second electronic components (DRAM) may be attached to the first redistribution structure. As a result, a semiconductor device structure may be produced.

The method 2 is merely an example, and is not intended to limit the present disclosure beyond what is explicitly recited in the claims. Additional operations can be provided before, during, or after each operations of the method 2, and some operations described can be replaced, eliminated, or reordered for additional embodiments of the method. In some embodiments, the method 2 can include further operations not depicted in FIG. 3. In some embodiments, the method 2 can include one or more operations depicted in FIG. 3.

FIG. 4A, FIG. 4B, FIG. 4C, FIG. 4D, FIG. 4E, FIG. 4F, and FIG. 4G illustrate one or more stages of an exemplary method of manufacturing a semiconductor device structure according to some embodiments of the present disclosure.

Figure 4A:
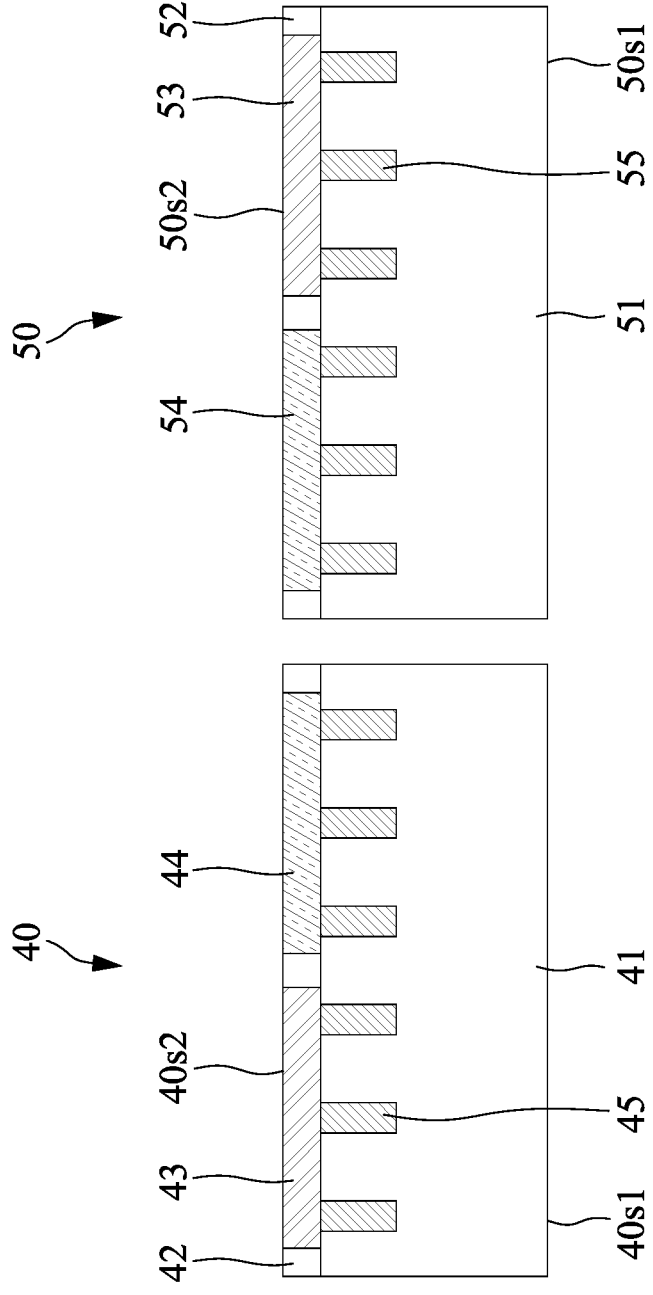
FIG. 4A illustrate one or more stages of an exemplary method of manufacturing a semiconductor device structure according to some embodiments of the present disclosure.

Referring to FIG. 4A, a semiconductor die 40 and a semiconductor die 50 may be provided. The semiconductor die 40 may have a surface 40s1 and a surface 40s2 opposite to the surface 40s1. The semiconductor die 40 may include a semiconductor substrate 41, a circuit region 42, and through vias 45. The circuit region 42 may include a memory control circuit 43 and a cache memory 44. The memory control circuit 43 may be located adjacent to the surface 40s2. The cache memory 44 may be located adjacent to the surface 40s2. The through via 45 may penetrate a portion of the semiconductor substrate 41 and extend from the surface 40s1. The semiconductor die 50 may have a surface 50s1 and a surface 50s2 opposite to the surface 50s1. The semiconductor die 50 may include a semiconductor substrate 51, a circuit region 52, and through vias 55. The circuit region 52 may include a memory control circuit 53 and a cache memory 54. The memory control circuit 53 may be located adjacent to the surface 50s2. The cache memory 54 may be located adjacent to the surface 50s2. The through via 55 may penetrate a portion of the semiconductor substrate 51 and extend from the surface 50s1.

Figure 4B:
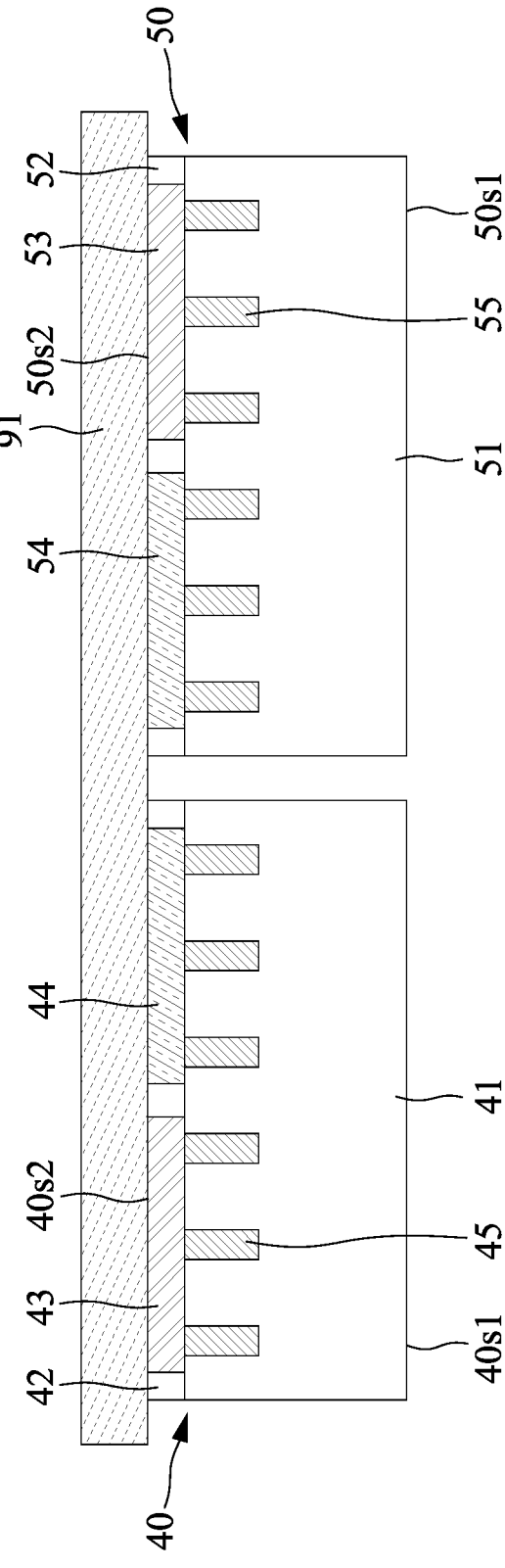
FIG. 4B illustrate one or more stages of an exemplary method of manufacturing a semiconductor device structure according to some embodiments of the present disclosure.

Referring to FIG. 4B, the semiconductor dies 40 and 50 may be attached to a supporter 91. In some embodiments, the supporter 91 may include a glass carrier, a ceramic carrier, a plastic carrier, or other suitable carriers. The surface 40s2 of the semiconductor die 40 may be attached to the supporter 91. The surface 50s2 of the semiconductor die 40 may be attached to the supporter 91.

Figure 4C:
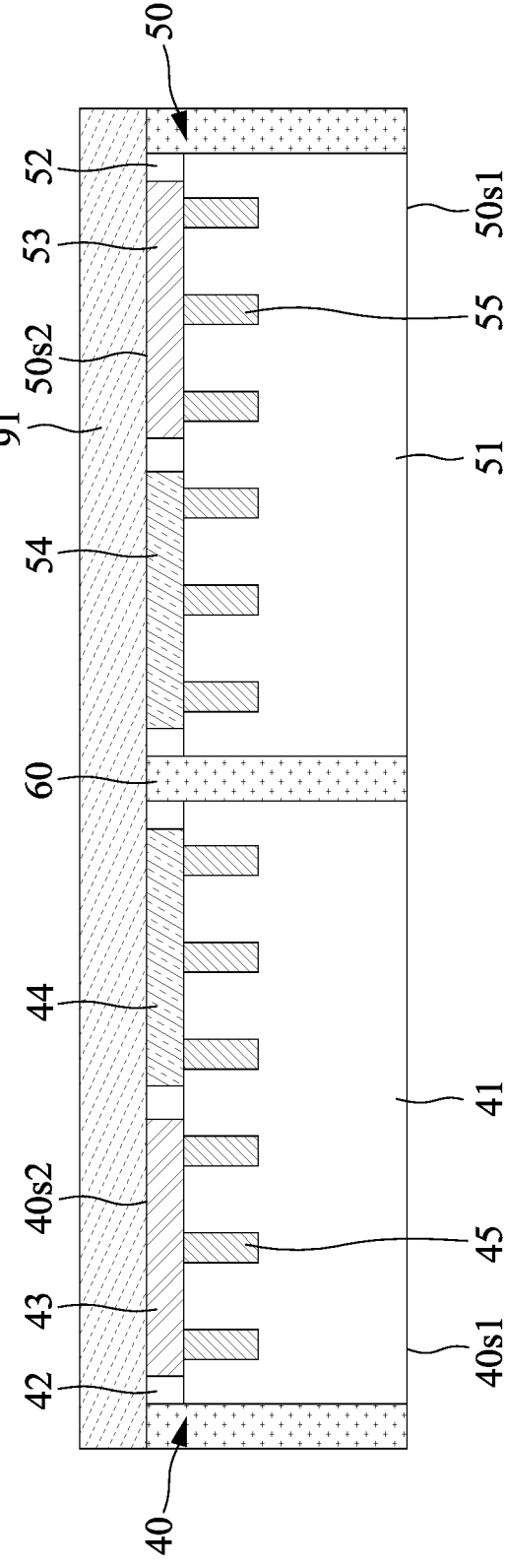
FIG. 4C illustrate one or more stages of an exemplary method of manufacturing a semiconductor device structure according to some embodiments of the present disclosure.

Referring to FIG. 4C, an encapsulant 60 may be formed on the supporter 91. The encapsulant 60 may encapsulate the semiconductor die 40. The encapsulant 60 may encapsulate the semiconductor die 50.

Figure 4D:
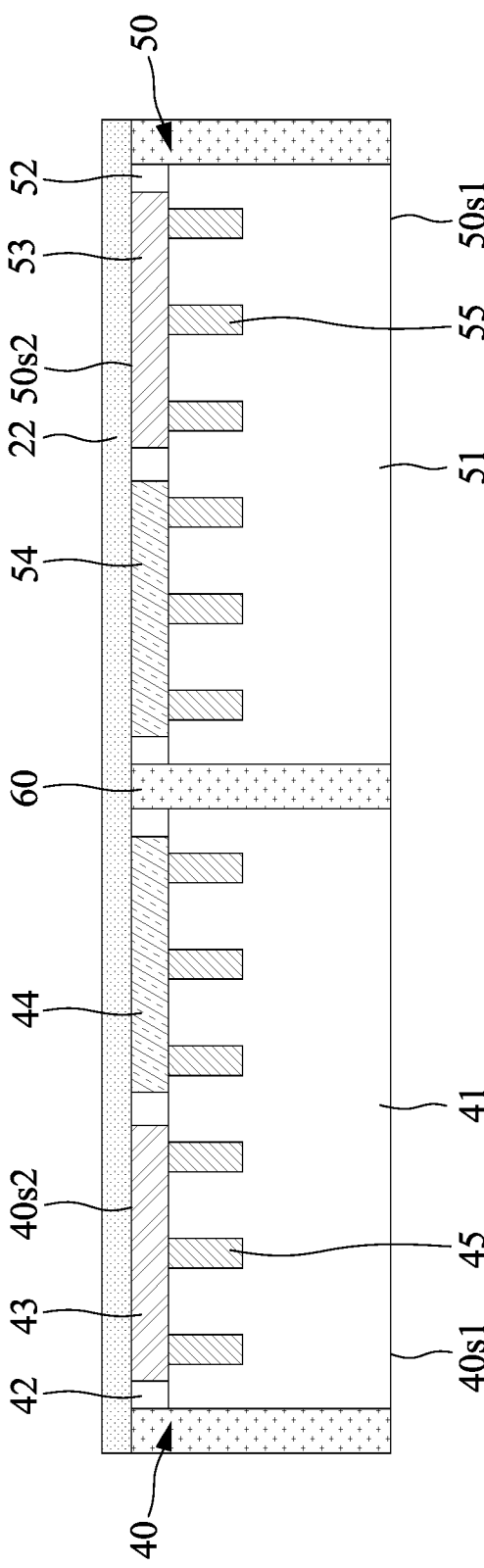
FIG. 4D illustrate one or more stages of an exemplary method of manufacturing a semiconductor device structure according to some embodiments of the present disclosure.

Referring to FIG. 4D, the supporter 91 may be removed from the semiconductor dies 40 and 50. A redistribution structure 22 may be formed on the surface 40s2 of the semiconductor die 40. The redistribution structure 22 may be formed on the surface 50s2 of the semiconductor die 50. The redistribution structure 22 may be formed on the top surface of the encapsulant 60.

Figure 4E:
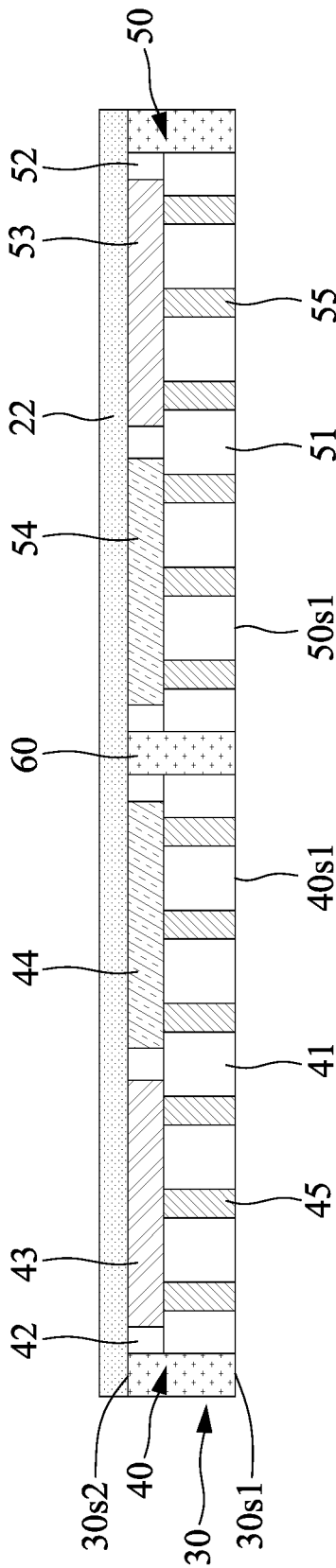
FIG. 4E illustrate one or more stages of an exemplary method of manufacturing a semiconductor device structure according to some embodiments of the present disclosure.

Referring to FIG. 4E, a polishing technique and/or a grinding technique may be performed on the surface 40s1 of the semiconductor die 40 and the surface 50s1 of the semiconductor die 50. A portion of the semiconductor substrate 41 may be removed. A portion of the semiconductor substrate 51 may be removed. The through via 45 may be exposed from the surface 40s1 of the semiconductor die 40. The through via 55 may be exposed from the surface 50s2 of the semiconductor die 50. As a result, an interposer 30, including the semiconductor dies 40 and 50, may be produced.

Figure 4F:
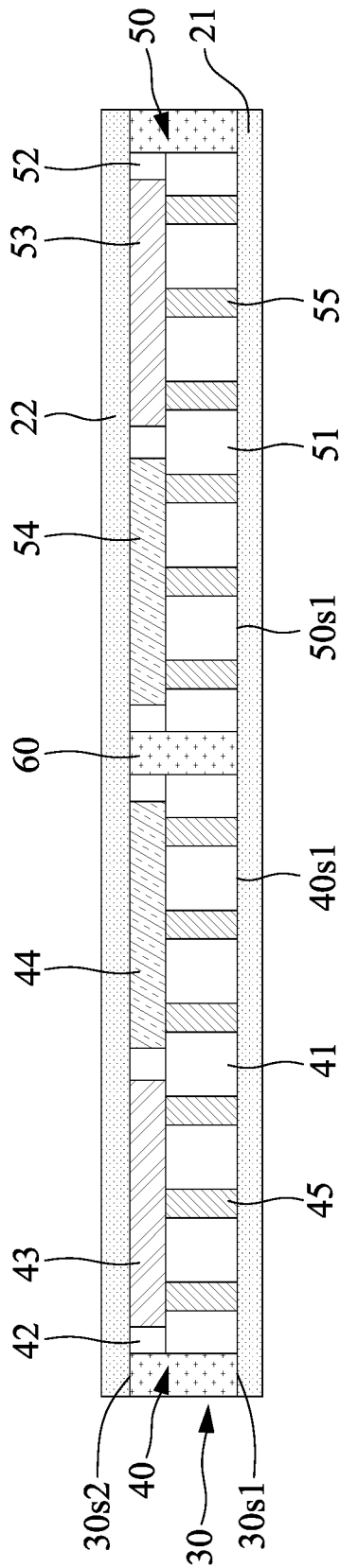
FIG. 4F illustrate one or more stages of an exemplary method of manufacturing a semiconductor device structure according to some embodiments of the present disclosure.

Referring to FIG. 4F, a redistribution structure 21 may be formed on the surface 40s1 of the semiconductor die 40. The redistribution structure 21 may be formed on the surface 50s1 of the semiconductor die 50. The redistribution structure 21 may be formed on the bottom surface of the encapsulant 60.

Figure 4G:
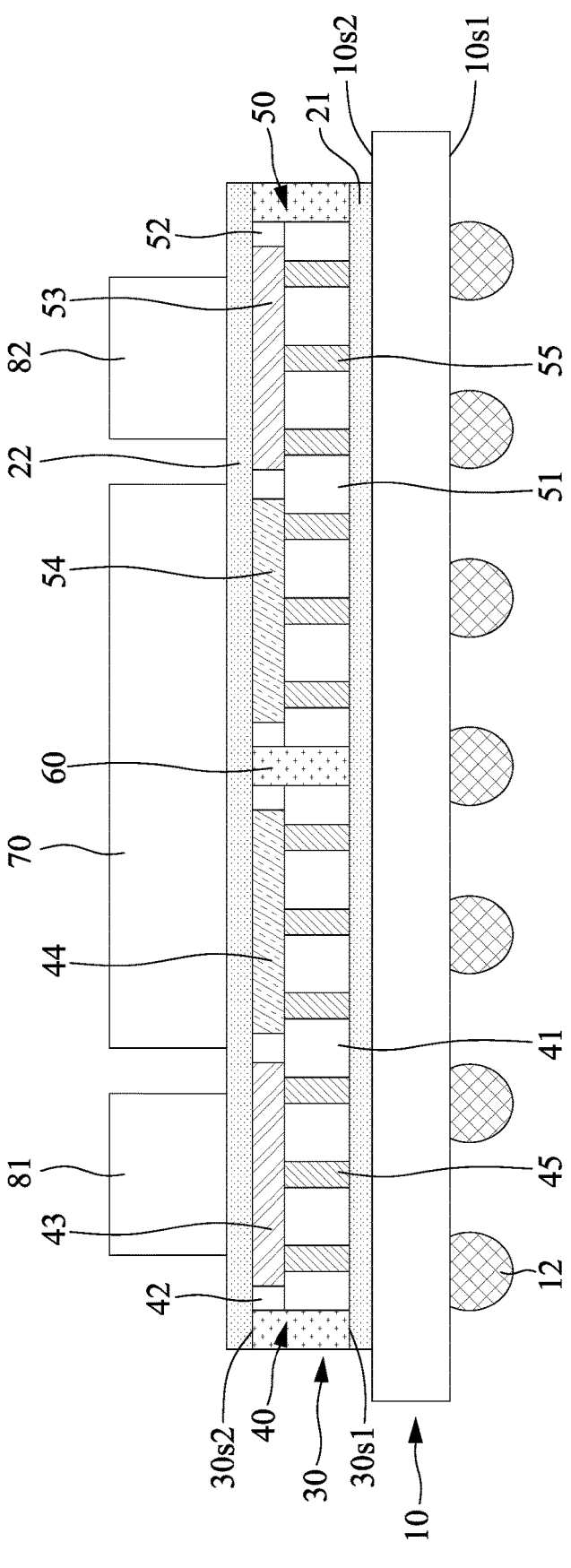
FIG. 4G illustrate one or more stages of an exemplary method of manufacturing a semiconductor device structure according to some embodiments of the present disclosure.

Referring to FIG. 4G, the redistribution structure 21 may be attached to a carrier 10. An electronic component 70 may be attached to the redistribution structure 22. Electronic components 81 and 82 may be attached to the redistribution structure 22. As a result, a semiconductor device structure, such as the semiconductor device structure 1a as shown in FIG. 1A and FIG. 1B, may be produced.

One aspect of the present disclosure provides a semiconductor device structure. The semiconductor device structure includes an interposer and a first electronic component. The interposer includes a first semiconductor die and a second semiconductor die. The first semiconductor die includes a first cache memory and a first memory control circuit. The second semiconductor die includes a second cache memory and a second memory control circuit. The first electronic component is disposed on the interposer and in communication with the first semiconductor die and the second semiconductor die.

Another aspect of the present disclosure provides another semiconductor device structure. The semiconductor device structure includes an interposer, a first redistribution structure, and a first electronic component. The interposer has a first surface and a second surface opposite to the first surface. The interposer includes a first semiconductor die including a first cache memory and a first memory control circuit. The first redistribution structure is disposed on the second surface of the interposer. The first electronic component is disposed on the first redistribution structure. The first electronic component is electrically connected to the first cache memory.

Another aspect of the present disclosure provides a method of manufacturing a semiconductor device structure. The method includes: providing a first semiconductor die and a second semiconductor die, wherein the first semiconductor die comprises a first cache memory, and the second semiconductor die comprises a second cache memory; forming a first redistribution structure on the first semiconductor die and the semiconductor die; providing a first electronic component on the first redistribution structure, wherein the first electronic component is in communication with either the first cache memory, the second cache memory, or both by the first redistribution structure.

In the embodiments of the present disclosure, the semiconductor device structure includes an electronic component and a semiconductor die. The logic circuit(s) and the cache memory are disposed within the electronic component and the semiconductor die, respectively. Therefore, the size of the electronic component is reduced, which thereby assists in the miniaturization of the semiconductor device structure. Further, the cache memories may include at least two portions disposed within two semiconductor dies. As a result, the logic circuit(s) may be in communication with one or two or more semiconductor dies according to requirements. Further, such design may improves the yield of manufacturing the semiconductor device structure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device structure, comprising:
an interposer, comprising:
a first semiconductor die comprising a first circuit region, a first cache memory and a first memory control circuit, wherein the first cache memory and the first memory control circuit are spaced apart from each other and are disposed within the first circuit region; and
a second semiconductor die comprising a second circuit region, a second cache memory and a second memory control circuit, wherein the second cache memory and the second memory control circuit are spaced apart from each other and are disposed within the second circuit region; and
a first electronic component disposed on the interposer and in communication with the first semiconductor die and the second semiconductor die.

2. The semiconductor device structure of claim 1, further comprising:
a redistribution structure disposed between the interposer and the first electronic component.

3. The semiconductor device structure of claim 2, further comprising:
a second electronic component disposed on the interposer, wherein the second electronic component is in communication with the first electronic component by the redistribution structure;
wherein the second electronic component vertically overlaps with the first memory control circuit and is free from vertically overlapping with the first cache memory.

4. The semiconductor device structure of claim 3, wherein the second electronic component comprises a dynamic random access memory (DRAM).

5. The semiconductor device structure of claim 4, wherein the first cache memory is a static random access memory (SRAM).

6. The semiconductor device structure of claim 5, wherein the second cache memory is the SRAM.

7. The semiconductor device structure of claim 1, wherein the first cache memory and the first memory control circuit of the first semiconductor die and the second cache memory and the second memory control circuit of the second semiconductor die have a mirror symmetry that the first cache memory is closer to the second cache memory than the first memory control circuit is, such that the first cache memory and the second cache memory are positioned between the first memory control circuit and the second memory control circuit.

8. The semiconductor device structure of claim 1, wherein the first cache memory is closer to the second memory control circuit than to the second cache memory.

9. The semiconductor device structure of claim 1, further comprising:
an encapsulant encapsulating the first semiconductor die and the second semiconductor die.

10. The semiconductor device structure of claim 1, wherein the first semiconductor die has a first surface and a second surface opposite to the first surface and facing the first electronic component, wherein the first cache memory is disposed adjacent to the second surface of the first semiconductor die.

11. The semiconductor device structure of claim 10, wherein the first semiconductor die comprises a through via extending from the first surface of the first semiconductor die.

12. The semiconductor device structure of claim 1, wherein the first electronic component is positioned above and vertically overlaps the first cache memory and the second cache memory,
wherein the first electronic component is positioned above and free from vertically overlapping the first memory control circuit and the second memory control circuit.

* * * * *